US007875876B1

(12) United States Patent
Wandzura et al.

(10) Patent No.: US 7,875,876 B1
(45) Date of Patent: Jan. 25, 2011

(54) SCALABLE QUANTUM COMPUTER

(75) Inventors: Stephen Wandzura, Agoura Hills, CA (US); Mark F. Gyure, Oak Park, CA (US); Bryan Ho Lim Fong, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 1259 days.

(21) Appl. No.: 11/453,746

(22) Filed: Jun. 15, 2006

(51) Int. Cl.
*H01L 31/00* (2006.01)
(52) U.S. Cl. .......... 257/26; 257/E29.076; 257/E29.168; 257/E49.003
(58) Field of Classification Search .................. 257/26, 257/E29.076, E29.168, E49.004
See application file for complete search history.

(56) References Cited

U.S. PATENT DOCUMENTS 5,793,091 A  8/1998  Devoe
6,472,681 B1 10/2002  Kane

OTHER PUBLICATIONS

Isailovic et al. "Interconnection Networks for Scalable Quantum Computers," arXiv:quant-ph/0604048v1, Apr. 6, 2006.*

Kane, "A Silicon-based nuclear spin quantum computer," Nature, vol. 393, pp. 133-137, 1998.
DeVoe, "Elliptical ion traps and trap arrays for quantum computation," Physical Review A, vol. 58, pp. 910-914, 1998.
Copsey, et al., "Toward a scalable, silicon-based quantum computing architecture," IEEE Journal of Selected Topics in Quantum Electronics, vol. 9, pp. 1552-1569.

* cited by examiner

*Primary Examiner*—Davienne Monbleau
*Assistant Examiner*—Matthew Reames
(74) *Attorney, Agent, or Firm*—Tope-McKay & Assoc.

(57) ABSTRACT

Described is a scalable quantum computer that includes at least two classical to quantum interface devices, with each being connected to a distinct quantum processing unit (QPU). An Einstein-Podolsky-Rosen pair generator (EPRPG) is included for generating an entangled Einstein-Podolsky-Rosen pair that is sent to the QPUs. Each QPU is quantumly connected with the EPRPG and is configured to receive a mobile qubit from the EPRPG and perform a sequence of operations such that the mobile qubit interacts with a source qubit when a teleportation algorithm is initiated, leaving a second mobile qubit in the original quantum state of the source qubit.

36 Claims, 3 Drawing Sheets

SCALABLE QUANTUM COMPUTER

BACKGROUND OF THE INVENTION (1) Field of the Invention

The present invention relates to a quantum computer and, more particularly, to a scalable architecture for a universal quantum computer containing distinct classical and quantum computational units, as well as distinct classical and quantum communication channels.

(2) Description of Related Art

A quantum computer is a computational device that utilizes quantum mechanical phenomena (e.g., superposition and entanglement) to perform operations on data. In a quantum computer, the amount of data is measured in qubits. Conversely, in a classical computer, it is measured in bits. An underlying principle of a quantum computer is that the quantum properties of particles are used to represent and structure data. Quantum mechanisms are then used to perform operations with the data.

A silicon-based quantum computing architecture was proposed by Kane in "A Silicon-Based Nuclear Spin Quantum Computer," Nature, Vol. 393, pp. 133-137, 1998 and patented in U.S. Pat. No. 6,472,681. Additionally, an ion-trap based quantum computing architecture was patented by DeVoe in U.S. Pat. No. 5,793,091 and also described in DeVoe, "Elliptical Ion Traps and Trap Arrays for Quantum Computation," Physical Review A, Vol. 58, pp. 910-914, 1998. The Kane quantum computer architecture is further analyzed and extended in Copsey et al., "Toward a Scalable, Silicon-Based Quantum Computing Architecture," IEEE Journal of Selected Topics in Quantum Electronics, Vol. 9, pp. 1552-1569.

The Kane quantum computer architecture proposal stores quantum information (qubits) in the form of phosphorous atom nuclear spins distributed in a silicon semiconductor. One and two qubit operations may be performed by applying voltages to metallic gates near the phosphorous atoms. Two qubit operations include the swap operation between spatially adjacent qubits, which allows for the communication of quantum information along swap chains or "quantum wires." Copsey et al. extended the Kane proposal by including long distance communication of quantum information via Einstein-Podolsky-Rosen (EPR) pair distribution and teleportation. Because of the different costs of long and short distance quantum communication, Copsey et al. proposed a hierarchical arrangement for the physical quantum bits storing the logical quantum bits.

There are several major disadvantages to the Kane-Copsey silicon quantum computer architecture. Though Copsey et al. considered the physical limits in placing classical gates near the phosphorous atoms, they did not describe the classical control electronics necessary to perform the quantum operations, nor the spatial structure of the classical control electronics. Additionally, the software to control the classical electronics was not mentioned in respect to the Kane-Copsey architecture. Copsey et al. failed to address the problem of spatial layout of the classical gate control wires and electronics, particularly with respect to the long quantum swap chains necessary for EPR pair distribution. Finally, quantum error-correction in the Kane-Copsey architecture is to be performed entirely within its hardware.

The Devoe quantum computer architecture is based upon arrays of elliptical ion traps. Each ion trap contains multiple arrays of ions, with each ion storing a physical qubit. Single qubit operations on ions are performed using properly timed laser pulses. Two qubit and quantum communication operations between ions in a single trap are mediated by collective phonon modes of the trapped ions. Quantum communication between ions in different traps is accomplished by placing the traps in a cavity, and using the photon cavity modes to mediate between the designated spatially separated ions.

Like the Kane architecture, the Devoe architecture does not address the classical control electronics and software necessary to perform the various quantum algorithms. Additionally, the physical location of the ion traps must be such that a cavity photon mode is able to transmit quantum information from one trap to another; distributed ion traps are not supported. However, the Devoe architecture may be extended to use teleportation (Bose et al., "Proposal for Teleportation of an Atomic State via Cavity Decay," Physical Review Letters, Vol. 83, pp. 5158-5161, 1999; Browne et al., "Robust Creation of Entanglement between Ions in Spatially Separate Cavities," Physical Review Letters, Vol. 91, 067901, 2003), in which case distributed ion traps are possible. Finally, error-correction is not addressed by the Devoe architecture.

Both the Kane-Copsey and Devoe inventions describe specific implementations of quantum computer architectures. Both of the references fail to provide all the components necessary for a complete architecture for a quantum computer: local quantum computation, distributed quantum computation, classical control electronics, classical control software, and error-correction.

Thus, a continuing need exists for a general quantum computer architecture framework that includes all the necessary components for a complete quantum computer where the components may be implemented using several different technologies.

SUMMARY OF INVENTION

The present invention relates to a scalable quantum computer. The Scalable quantum computer comprises a first classical to quantum interface device (CQI) connected with a first quantum processing unit (QPU) and configured to control the first QPU. A second CQI is connected with a second QPU and configured to control the second QPU. The CQIs are configured to send and receive classical communications to and from a classical central processing unit (CCPU). A pair generator is included for generating a pair of entangled mobile quantum bits (qubits), with each mobile qubit being sent to a QPU. The first QPU has a source qubit with an original quantum state and is connected with the pair generator via a quantum communication channel. The first QPU is configured to receive a mobile qubit from the pair generator and perform a sequence of operations such that the mobile qubit interacts with the source qubit when a teleportation algorithm is initiated, during which the source qubit and the mobile qubit are measured with the result of the measurement being teleported to a second QPU. The second QPU is connected via a quantum communication channel with the pair generator. The second QPU is configured to receive a mobile qubit from the pair generator and to receive the result of the measurement from the first QPU. The second QPU is further configured to perform operations on the mobile qubit that correlate to the result of the measurement and leave the mobile qubit in the second QPU in the original quantum state of the source qubit in the first QPU.

In another aspect, the pair generator is an Einstein-Podolsky-Rosen pair generator (EPRPG) for generating an entangled Einstein-Podolsky-Rosen (EPR) pair, with the EPR being the pair of entangled mobile quantum bits (qubits).

In yet another aspect, each QPU is configured to store at least two resident qubits, a source qubit and a mobile qubit;

perform one and two qubit logical operations on its resident qubits; and measure the states of its resident qubits.

Additionally, the EPRPG is connected via a quantum communication channel with the QPUs via a uni-directional quantum communication channel with a flow from the EPRPG to the respective QPU.

In another aspect, the present invention further comprises a classical central processing unit (CCPU) classically connected with the CQIs and the EPRPG.

Additionally, a random access memory (RAM) is classically connected with the CCPU, the CQIs, and the EPRPG.

Furthermore, a purification protocol is included for receiving mobile qubits prior to the QPU and executing a set of quantum logic operations on them to create a single EPR pair of high entanglement fidelity.

In another aspect, the scalable quantum computer is configured to perform the following operations in a teleportation algorithm:
 apply physical qubit operations to the mobile qubit and the source qubit in the first QPU;
 measure the source qubit and the mobile qubit in the first QPU;
 classically communicate the measurement results from the first CQI to the CCPU;
 CCPU process the measurement results; and
 instruct the second CQI to perform certain first CQI measurement dependent physical qubit operations on the mobile qubit in the second QPU.

In yet another aspect, the present invention further comprises additional QPUs for receiving the mobile qubits. The additional QPUs and the first and second QPUs collectively referred to as a plurality of QPUs, with the plurality of QPUs and the EPRPG collectively referred to as a quantum computer group.

In another aspect, a switching network is included for directing the mobile qubits from the EPRPG to two QPUs in the plurality of QPUs.

In yet another aspect, the present invention further comprises a plurality of quantum computer groups and an EPRPG quantumly connected with the EPRPGs in the plurality of quantum computer groups.

Additionally, the CQIs are configured to receive classical communications from the CCPU specifying logical qubit operations to be performed on the QPU qubits, with the CQIs translating the logical qubit operations into physical operations on the resident qubits.

Furthermore, the CQIs are configured to receive classical communications from the CCPU specifying physical operations to be performed on the QPU qubits.

Finally, as can be appreciated by one skilled in the art, the present invention also includes a method comprising acts of forming the scalable quantum computer described herein.

BRIEF DESCRIPTION OF THE DRAWINGS

The objects, features and advantages of the present invention will be apparent from the following detailed description of the various aspects of the invention in conjunction with reference to the following drawings, where.

DETAILED DESCRIPTION

Figure 1:
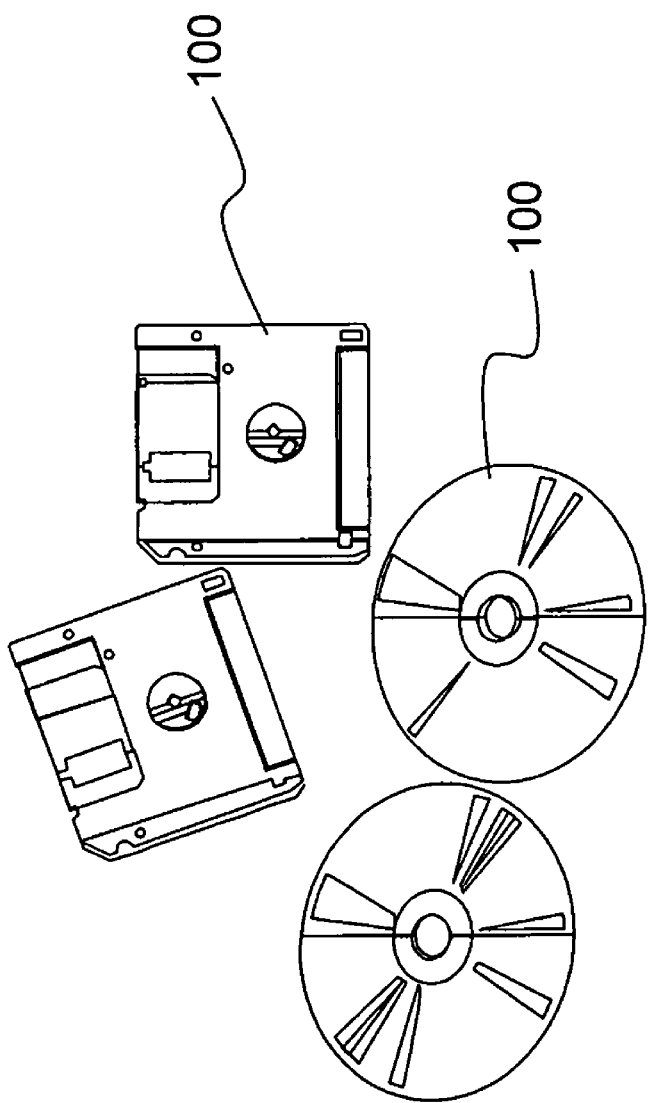
FIG. 1 is an illustrative diagram of a computer program product embodying the present invention.

The present invention relates to a quantum computer and, more particularly, to a scalable architecture for a universal quantum computer containing distinct classical and quantum computational units, as well as distinct classical and quantum communication channels. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first a glossary of terms used in the description and claims is given as a central resource for the reader. Next, a description of various principal aspects of the present invention is provided. Third, an introduction is provided to provide the reader with a general understanding of the present invention. Finally, a description of various aspects of the present invention is provided to give an understanding of the specific details.

(1) Glossary

Before describing the specific details of the present invention, a glossary is provided in which various terms used herein and in the claims are defined. The glossary provided is intended to provide the reader with a general understanding of the intended meaning of the terms, but is not intended to convey the entire scope of each term. Rather, the glossary is intended to supplement the rest of the specification in more accurately explaining the terms used.

Classical Central Processing Unit (CCPU)—The term "CCPU" refers to a central processing unit that is used in a classical computing sense.

Classical Communication—The term "classical communication" refers to communication between classical components.

Classical Random Access Memory (CRAM)—The term "CRAM" refers to a type of computer memory that can be accessed randomly such that any byte of memory can be accessed without touching the preceding byte.

Classical to Quantum Interface (CQI)—The term "CQI" refers to an interface module for interfacing between a quantum processing unit and a classical data bus.

Einstein-Podolsky-Rosen pair (EPR)—The term "EPR pair" refers to a pair of entangled mobile quantum bits (qubits) that are generated by the EPRPG (see below).

Einstein-Podolsky-Rosen Pair Generator (EPRPG)—The term "EPRPG" refers to a device that generates EPR pairs.

Instruction Means—The term "instruction means" as used with respect to this invention generally indicates a set of operations to be performed on a computer, and may represent pieces of a whole program or individual, separable, software modules. Non-limiting examples of "instruction means" include computer program code (source or object code) and "hard-coded" electronics (i.e., computer operations encoded on a computer chip). The "instruction means" may be stored in the memory of a computer or on a computer-readable data storage medium such as a floppy disk, a CD-ROM, or a flash drive.

Logical Qubit Operations—The term "logical qubit operations" refers to quantum logic operations performed on groups of physical qubits that represent an encoded logical qubit.

Physical Qubit Operations—The term "physical qubit operations" refers to quantum logic operations applied to individual physical qubits.

Quantum Communication—The term "quantum communication" refers to the transfer of quantum information (i.e., information represented as the state of a quantum mechanical system), rather than information represented in a classical analog or digital form.

Quantumly Connected—The term "quantumly connected" means that entanglement is shared across a communication channel (i.e., one half of an entangled qubit pair resides at each end of the channel).

Quantum Processing Unit (QPU)—The term "QPU" refers to a device or set of devices that processes quantum information.

Qubit—The term "qubit" refers to a quantum bit which is the quantum computing analog to a bit. Qubits can exhibit superposition. Thus, unlike normal bits, qubits can be both 0 and 1 at the same time.

(2) Principal Aspects

The present invention has three "principal" aspects. The first is a scalable quantum computer system. The system is typically in the form of a computer system operating software or in the form of a "hard-coded" instruction set. This system may be incorporated into a wide variety of devices that provide different functionalities. The second principal aspect is a method, typically in the form of software, operated using a data processing system (computer). The third principal aspect is a computer program product. The computer program product generally represents computer-readable code stored on a computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

An illustrative diagram of a computer program product embodying the present invention is depicted in FIG. 1. The computer program product 100 is depicted as an optical disk such as a CD or DVD. However, as mentioned previously, the computer program product generally represents computer-readable instructions stored on any compatible computer-readable medium.

(3) Introduction

The present invention is a scalable architecture for a universal quantum computer. A block diagram depicting the components of the scalable quantum computer 200 of the present invention is provided in FIG. 2. The scalable quantum computer 200 comprises an input 202 for receiving information from a user and/or other input mechanisms. Note that the input 202 may include multiple "ports." An output 204 is connected with a classical central processing unit (CCPU) 206. Output may also be provided to other devices or other programs; e.g., to other software modules, for use therein. The input 202 and the output 204 are both coupled with the CCPU 206, which may be a general-purpose computer processor or a specialized processor designed specifically for use with the present invention. The processor 206 is coupled with a memory 208 to permit storage of data and software to be manipulated by commands to the processor. The memory 208 is any operable memory module, a non-limiting example of which includes a random access memory (RAM).

The architecture 200 contains distinct classical and quantum computational units, as well as distinct classical and quantum communication channels. The classical communication channels 210 are depicted by solid lines while the quantum communication channels are depicted by dashed lines 212. All classical computation and communication channels may use standard classical computing technology. Quantum computational units are comprised of quantum bits (qubits), which store the quantum data for a given quantum algorithm. Manipulation of qubits is controlled by classical-quantum interface devices (CQI) 214a through 214n, which are in turn controlled by purely classical computational units (i.e., generated by a classical computer processing unit (CCPU) 206) over a classical communication bus. A pair generator is used to generate a pair of entangled mobile quantum bits (qubits) that are distributed over the quantum communication channels 212. The pair generator is any suitable pair generator that can generate a pair of qubits for distribution over quantum communication channels, a non-limiting example of which includes an Einstein-Podolsky-Rosen pair generator (EPRPG) 216. The EPRPG 216, the quantum communication channels 212, and the classical communication channels 210 enable teleportation of quantum states between distributed quantum computational units.

Existing proposed quantum computer implementations suffer from both scalability problems and a failure to identify and classify the components necessary for a complete architecture. The prior art addresses components of a quantum computer architecture, but not the entire framework for a functioning quantum computer, including the necessary classical control. The necessary classical control includes both classical electronics and classical software, and is described in further detail below. A major shortcoming of the prior art is the expectation and proposed use of bidirectional quantum communication. The present invention shows that unidirectional quantum communication channels 212 are sufficient to propagate quantum information to arbitrary quantum processing units (QPUs) 218a through 218n.

Key technologies of the present invention include the CQI 214a-N device, the EPRPG 216, and the EPR to stationary qubit converter (which is optionally included in the QPU 218a-N). In particular, without an EPR pair member-to-stationary qubit converter, all physical qubits must be of the same type (i.e., all electron spins, or all atomic states, or all photon polarizations). A quantum computer with only a single type of physical qubit fails to exploit the advantages of each of the different physical qubit representations. That is, photon polarizations can be transmitted stably over long distances, while electron spins can interact easily with each other. It is not obvious that the EPR pair member-to-stationary qubit conversion is only unidirectional, and so multiple physical qubit representations in a single quantum computer device have been overlooked in the prior art.

The scalable quantum computer 200 is a device on which quantum factoring and search algorithms may be implemented. For example, the current standard for encrypted communication on the internet uses RSA (Rivest-Shamir-Adleman) public/private key methods. The security of the RSA algorithm depends on the classical difficulty of factoring large integers. Existing classical methods of breaking RSA encryption are exponentially difficult in the bit length n of the number to be factored, with complexity $O(\exp(n^{1/3}(\log n)^{2/3}))$. O refers to the "order" of the algorithm, meaning that there may be other terms independent of n multiplying or adding to the expression within the parentheses, but the asymptotic or dominant behavior for large n is captured by the expression.

However, the quantum factoring algorithm provides a means to factor n bit numbers in $O(n^3)$ time. As such, the quantum computer device described herein can be integrally used to develop a new secure encryption means.

Additional applications for a quantum computer include the ability to solve problems that can be formulated as unstructured search problems using Grover's algorithm, as well as the simulation and modeling of both classical and quantum systems.

(4) Description of Various Aspects

Figure 2:
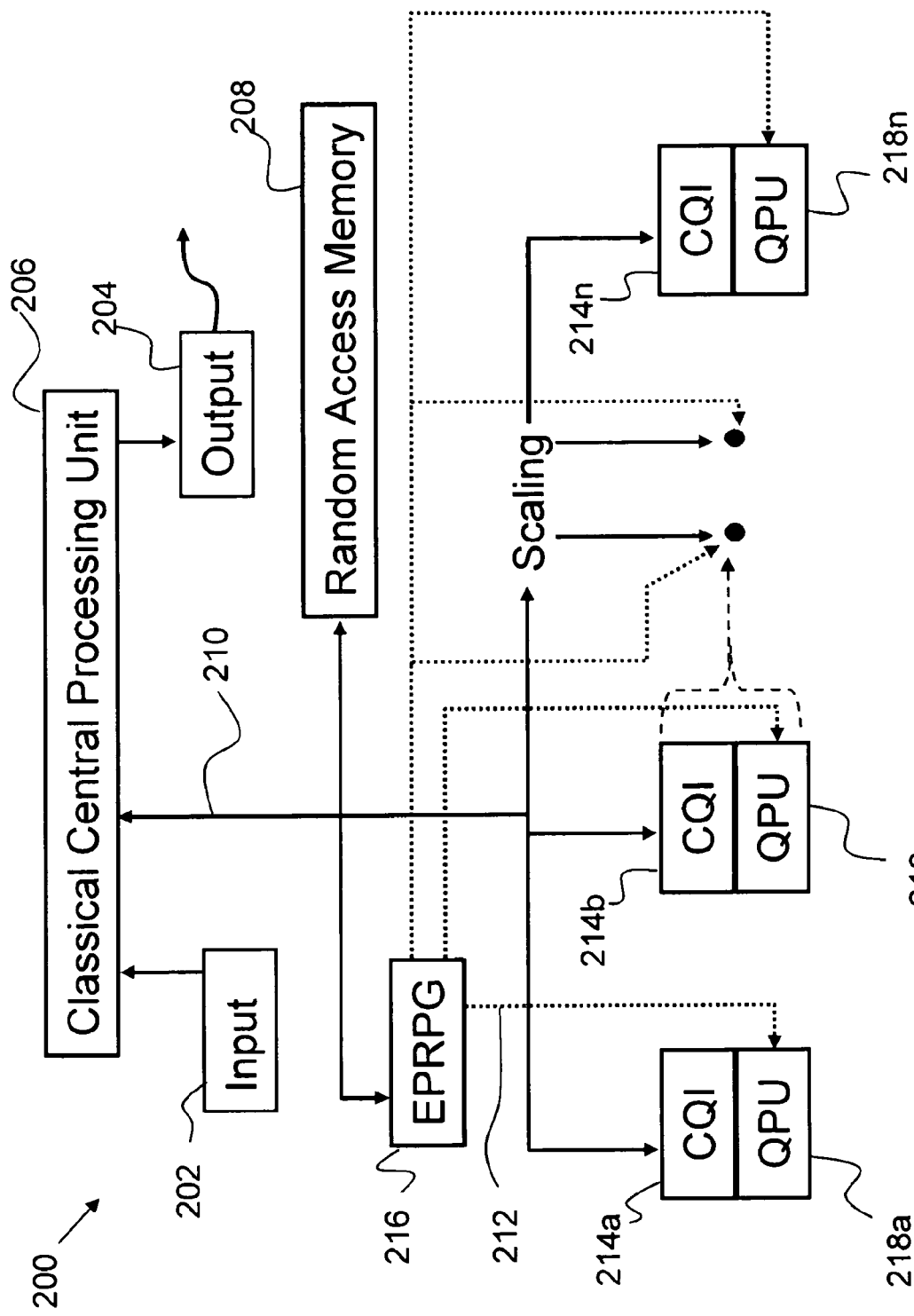
FIG. 2 is a flow chart illustrating a Scalable Quantum Computer architecture according to the present invention.

The scalable quantum computer 200 is comprised of the following components: a classical computer consisting of one or more classical central processing units (CCPUs) 206; classical random access memory (CRAM) 208, and magnetic storage media; one or more Einstein-Podolsky-Rosen pair generators (EPRPGs) 216; classical to quantum interface devices (CQIs) 214; and quantum processing units (QPUs) 218. The CCPUs 206 are classically connected 210 to the CRAM 208, the EPRPGs 216, and the CQIs 214 via a classical data+instruction communication bus. The quantum output of the EPRPGs 216 is connected via quantum communication channels 212 to the QPUs 218. Each QPU 218 is controlled by a CQI 214. As can be appreciated by one skilled in the art, although FIG. 2 depicts one CCPU 206 and one EPRPG 216, the quantum computer 200 is scalable so that it can include multiple EPRPGs 216 and CCPUs 206.

Each QPU 218 must be able to store at least two logical (e.g., source) quantum bits (qubits), perform one and two qubit logical operations on its resident qubits (i.e., source qubit and mobile qubit from the EPRPG 216), and measure the states of its resident physical qubits. The resident qubits are measured using a technique to measure more than one qubit simultaneously, a non-limiting example of which includes using a joint-Bell state measurement. Two logical qubits are encoded using multiple physical qubits, with the actual number of physical qubits dependent on the quantum error-correction scheme chosen. The quantum error-correction is referred to as "hardware error-correction." The invention also provides for software error-correction, which is described below. A logical qubit operation is encoded into physical qubit operations dependent upon the hardware error-correction scheme, with the logical one and two qubit operations decomposed into physical one and two qubit operations on the multiple physical qubits. The physical one and two qubit operations, as well as the measurement operations, are controlled by the CQI 214 device attached to the given QPU 218. The CQI 214 device, in turn, receives classical communications from the CCPU 206 specifying logical instructions (i.e., logical qubit operations) to be performed on the QPU 218 logical qubits. The CQI 214 translates the logical qubit operations into the physical operations on the resident QPU 218 qubits (an alternative scheme has the CCPU 206 directly issuing the physical qubit operations to each CQI 214.)

Physical operations on the qubits refers to the specific gate operations that are performed on the qubits, as opposed to logical operations. For example, controlled NOT (CNOT) operations are performed using a pair of qubits, however, CNOT is a logical operation and is not necessarily a physical (i.e., hardware-level) operation. If CNOT is not an inherent or native physical operation, it must be decomposed into operations that are native or physical. In other words, physical operations are the actual hardware-level gate operations applied to qubits that alter their state.

A CNOT operation is a logical gate operation between two qubits. CNOT stands for "controlled-NOT", i.e., a logical gate operation is performed on one qubit (the target qubit) based upon the state of another qubit (the source or control qubit). The CNOT operation flips the state of the target qubit when the source qubit is in the "1" state. As a non-limiting example, the CNOT operation has the following mapping on two qubits, where the first qubit is the source and the second qubit the target:

$$|00\rangle \text{ goes to } |00\rangle$$
$$|01\rangle \text{ goes to } |01\rangle$$
$$|10\rangle \text{ goes to } |10\rangle$$
$$|11\rangle \text{ goes to } |11\rangle$$

Communication of quantum information between distinct QPUs 218 is accomplished via quantum teleportation, using the classical communication bus and entangled EPR pairs generated by the EPRPG 216. For the single EPRPG architecture, quantum connections 212 between the EPRPG 216 and each of the QPUs 218 are necessary. Transfer of a physical qubit (i.e., the source qubit) from a first QPU 218a to a second QPU 218b requires an EPR pair, generated by the EPRPG 216, to be split between the first QPU 218a and the second QPU 218b. Teleportation of the source qubit at the first QPU 218a to the EPR pair member at the second QPU 218b follows a teleportation algorithm (protocol) comprising the following acts:

a. Application of physical qubit operations to the EPR pair member (i.e., mobile qubit) and the source qubit in the first QPU 218a;
b. Measurement of the two qubits (i.e., source qubit and mobile qubit) in the first QPU 218a;
c. Classical communication of the measurement results from a first CQI 214a to the CCPU 206;
d. CCPU 206 processing of the first CQI 214a measurement results;
e. Instructions by the CCPU 206 to a second CQI 214b to perform certain first CQI 214a measurement dependent physical qubit operations on the EPR member (i.e., mobile qubit) in the second QPU 218b.

When performing certain physical operations on the second mobile qubit, the result of a joint Bell state measurement on the source qubit in the first QPU 218a and the mobile qubit in the first QPU 218a yields two binary numbers. These numbers are transmitted through a classical communication channel 210 to the second QPU 218b and a "X rotation" and a "Z rotation" are performed "conditionally" on the mobile qubit in the second QPU 218b. Conditionally meaning that the rotations are either done or not done depending on the value of the two numbers that are the result of the joint Bell state measurement. These rotations are measurement-dependent physical qubit operations on the mobile qubit in the second QPU 218b.

The results of the measurements on the source qubit in the first QPU 218a and the mobile qubit in the first QPU 218a are either 0 or 1, resulting in four possible outcomes of the measurements on those two qubits (i.e., 00, 01, 10, and 11). For reference, the first number in the pair is the result of the measurement on the source qubit. Then, the rotations on the target qubit (the mobile qubit in the second QPU 281b) are done as follows:

| | |
|---|---|
| 00 | no X or Z rotation |
| 01 | X rotation only |
| 10 | Z rotation only |
| 11 | X rotation followed by Z rotation |

These rotations guarantee that the target qubit is now in exactly the same state as the original source qubit. The state of the source qubit has now been destroyed by the measurement, so its state has not been copied, but "teleported."

After this sequence of operations, the quantum state previously in the source qubit (i.e., in the first QPU 218a) is in the EPR pair member qubit (i.e., mobile qubit) at the second QPU 218b. Note that if the physical objects encoding the qubits in the QPUs 218 and the EPR pairs are different, the quantum information in the EPR pair members must be transferred to the QPU 218 physical objects before the teleportation acts described above. The physical objects are the stationary physical qubits on the QPU 218.

The transfer of quantum information in the form of the EPR pair is unidirectional such that the EPR pair members always move from the EPRPG 216 to the QPUs 218 via quantum communication channels 212, and never in the opposite direction. Classical information is communicated in two directions, from the CCPU 206 to the CQIs 214 and vice versa. The source qubit can be teleported to any QPU 218n under these conditions. In the case where multiple EPRPGs 216 are present, quantum communication between any two QPUs 218 is possible by ensuring that a path connecting any two QPUs 218 exists along the quantum communication channels 212 and through the EPRPGs 216. As in the single EPRPG 216 case, the quantum information transfer is unidirectional such that quantum information moves only from the EPRPGs 216 to the QPUs 218.

The architecture for the scalable quantum computer 200 is universal because of the universality of one and two qubit logical operations. If the coupled CQI 214 and QPU 218 device provides the Hadamard phase, Pi/8 single qubit logical operations, two qubit CNOT operation, and if quantum communication is possible between any two QPUs 218, any quantum unitary transform, and hence any quantum algorithm, may be approximated. Pi expresses the ratio of the circumference to the diameter of a circle.

Figure 3:
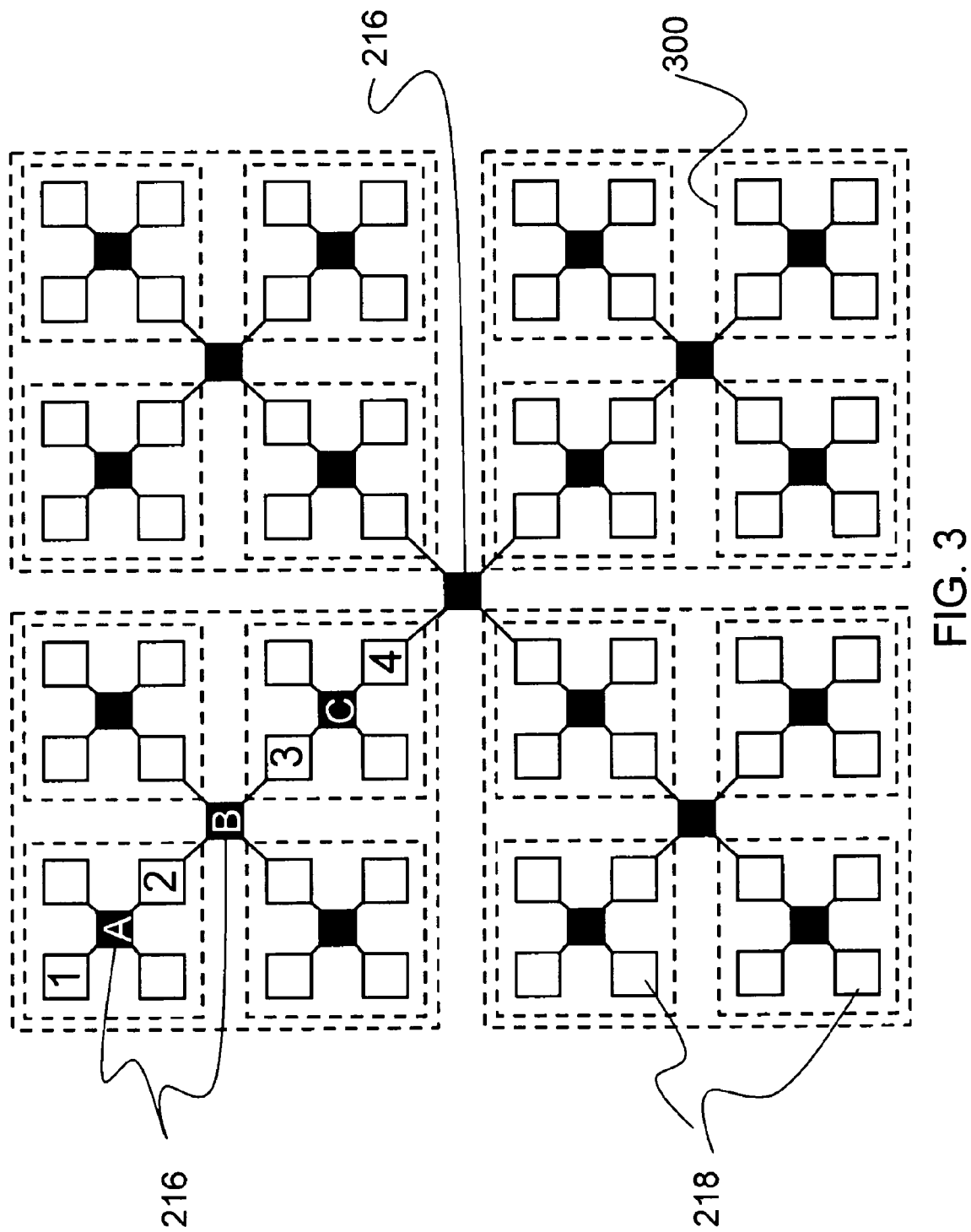
FIG. 3 is an illustrative diagram of a Scalable Quantum Computer architecture according to the present invention.

The architecture for the quantum computer 200 is also scalable because additional CQIs 214 and QPUs 218, as well as CCPUs 206 and EPRPGs 216, may be connected to an existing quantum computer using appropriate classical and quantum communication channels. To be scalable, communication of quantum information between any two QPUs 218 requires that members of an entangled pair of qubits be able to be delivered to the two QPUs 218. Many different QPU 218 layout and entangled pair distribution topologies meet this requirement. As a non-limiting example, the scalable quantum computer 200 may include a single EPRPG 216 and a switching network that delivers the EPR pairs to the QPUs 218. As another non-limiting example and as shown in FIG. 3, the scalable quantum computer may include a hierarchy of EPRPGs 216. In this aspect, at the lowest level of the hierarchy an EPRPG 216 is associated with some number of QPUs 218 (i.e., a plurality of QPUs 218), with the plurality of QPUs 218 and the EPRPG 216 collectively being a quantum computer group 300. At each higher level an EPRPG 216 is associated with a group (or a group of groups, etc.) of QPUs 218 (quantum computer groups 300). In a hierarchical layout, quantum communication between QPUs 218 then follows the entanglement-swapping protocol, a generalization of the usual teleportation protocol described above.

The normal teleportation protocol requires the creation of a Bell state (also known as the EPR pair) which is then distributed to the source and destination location of the desired quantum information transfer. Instead of physically distributing the entangled EPR pair to source and destination locations, however, entanglement can be created between qubits at source and destination locations via the entanglement swapping protocol. As a non-limiting example, when four qubits are arranged in a line, and each qubit can interact with its neighbors, the entanglement swapping protocol consists of the following acts:
 a. Referring to FIG. 3, put qubits 1 and 2, and qubits 3 and 4, into Bell states.
 b. Perform a joint Bell state measurement on qubits 2 and 3.
 c. Dependent on the outcome of the joint Bell state measurement in act b, apply X and/or Z operators to qubit 4.
 d. 4. Qubits 1 and 4 are now entangled and in a definite Bell state and can be used in the standard teleportation protocol.

Although the protocol described above is for a chain of 4 qubits, the entanglement swapping protocol can be generalized to a chain of arbitrary length. For the hierarchical quantum computer layout (shown in FIG. 3), the entanglement swapping protocol is combined with the usual teleportation protocol to transfer information between QPUs. For example and as shown in FIG. 3, quantum communication between QPUs 1 and 4 would proceed in the following fashion:
 a. EPR pair generators A and C create EPR pairs and distribute them to QPUs 1 and 2, and 3 and 4, respectively.
 b. A joint Bell state measurement is performed on the EPR pair member qubits in QPUs 2 and 3. To accomplish this, one must teleport the qubit in QPU 3 to QPU 2, i.e., EPR pair generator B creates an EPR pair and distributes it to QPUs 2 and 3. The usual teleportation protocol is used to teleport the EPR pair member from EPRPG C on QPU 3 to QPU 2. The joint Bell state measurement can now be performed on QPU 2.
 c. Apply X and/or Z to the EPR pair member from EPRPG C on QPU 4.
 d. Qubits on 1 and 4 are now in a definite Bell state and can be used in the standard teleportation protocol.

Beyond the basic hardware correction provided by the QPUs 218, software error-correction is also possible in the scalable quantum computer 200 architecture. In hardware error-correction, a logical qubit in each QPU is represented by some number of physical qubits based upon the chosen hardware error-correction scheme. However, one may use the logical qubits distributed across various QPUs 218 to encode another logical qubit, i.e., one may treat the lowest-level logical qubits as physical qubits with respect to higher-level logical qubits. This is referred to as a concatenated error-correction code in the literature. The error-correction code chosen to encode a logical qubit using other logical qubits is not built into the QPU 218 hardware, but may be controlled at the classical level by the CCPU 206. The scalable quantum computer 200 architecture thus allows the construction of a (classical) software library of error-correction codes. At the highest level (user interface) level, a quantum logical operation is specified, which the software library translates into encoded logical operations across the QPUs 218, dependent upon the chosen software error-correction code.

A quantum computation on the scalable quantum computer 200 is specified by a software program that consists of logical qubit operations on various logical qubits. The software program is completely classical, and is completely specified by the sequence of logical operations and the logical qubits upon which the logical operations act. Given the software error-correction desired, the logical qubit operations are converted by the CCPU 206 and a software compiler into encoded logical qubit operations using the software error-correction library. Since the CQI 214/QPU 218 devices implement only a basic set of one and two qubit logical operations, the encoded logical qubit operations must then be decomposed into the basic set of logical operations; this also is performed by the software compiler. Logical two qubit operations in the basic set of logical operations that involve two distributed logical qubits must be further decomposed into classical commands to the EPRPG 216 to generate EPR pairs, and to the specified CQI 214/QPU 218 devices to receive the EPR pairs. The CQI 214 devices receive the logical operation instructions and expected EPR pair arrival instructions, and translate these instructions into operations on physical qubits.

The quantum computer as described does not have physical locality requirements beyond those required by the EPR pair distribution. That is, a CQI 214/QPU 218 device may be physically distant from another CQI 214/QPU 218 device. The distance limitations are given by the fidelity of EPR pair transmission along the quantum communication channel 212, and the time required to propagate the classical measurement data between two CQI 214 devices.

The components for a scalable quantum computer 200 have a variety of possible implementations. For the QPUs 218, non-limiting examples of possible physical qubit implementations include electron spins in semiconductor quantum dots, atomic states of ions in ion traps, magnetic flux directions in superconducting Josephson junctions, and photon states in quantum electrodynamic cavities. The CQI 214 device implementation of course depends on the chosen QPU 218 implementation. For example, electron spins are controlled by voltage pulses on metallic gates in the semiconductor material, atomic states are controlled by laser pulses, magnetic flux quanta are controlled by superconducting circuits, and photon states are controlled with optical beam splitters and phase shifters.

The EPRPG 216 and the quantum communication channel 212 connecting the EPRPG 216 also have several possible implementations. EPR pairs may be created as entangled electron spins in semiconductor quantum dots, with the quantum communication channels 212 consisting of long swap wires (chains of electron spins) connecting the EPRPG 216 and the QPUs 218. Alternatively, EPR pairs may be created as entangled photon polarizations, with the quantum communication channels 212 consisting of single mode optical fibers. At the QPU 218 receiving end, purification protocols will be necessary to ensure teleportation fidelity. The purification protocols involve receiving mobile qubits and executing a set of quantum logic operations on them to create a single EPR pair of high entanglement fidelity.

Entanglement is not a binary property of two qubits, meaning that entanglement is not to be considered as qubits being either entangled or not entangled. The degree of entanglement between two qubits can vary continuously from zero to one (where one is usually denoted as full or maximal entanglement). In order for the teleportation algorithm to execute properly, the qubits must be very close to maximally entangled. The purification protocol is a way of using many non-maximally entangled qubit pairs to produce one maximally entangled pair.

If the EPR pairs and the physical qubits (e.g., source qubits) in the QPU 218 have different physical implementations, the EPR pair members must be converted to the QPU physical qubits using an appropriate EPR pair member-to-stationary qubit converter device. For example, with semiconductor electron spin qubits and photon EPR pairs, the quantum state of a photon EPR member must be converted into a semiconductor electron spin using any suitable photon polarization conversion technique. As a non-limiting example of an EPR pair member-to-physical qubit converter device, photon polarization conversion to electron spin may be accomplished in a properly engineered semiconductor, as described in Vrijen and Yablonovitch, "A Spin-Coherent Semiconductor Photo-Detector for Quantum Communication," arXiv:quant-ph/0004078 v2, 2000. Note that the photon state-to-electron state conversion is strictly unidirectional, just as communication between the EPRPG 216 and the QPUs 218 is strictly unidirectional.

An embodiment of the scalable quantum computer 200 architecture uses electron spins in semiconductor quantum dots to store physical qubit information in the QPUs 218. In this aspect, such a QPU 218 must be kept at low temperatures so that semiconductor phonon modes do not disturb the quantum dot spins. The physical qubits are manipulated by metallic gates and attendant electronics that comprise the CQI 214 device. The CQI 214 device operates by providing voltage pulses of proper timing and magnitude to the metallic gates, which induce quantum state modifications in the physical qubits. The CQI 214 device must also be kept at low temperatures to avoid de-coherence in nearby physical qubits. This aspect uses EPRPGs 216 that produce entangled photon polarization pairs, with conversion of photon polarization to electron spin performed using a mechanism such as the Vrijen-Yablonovitch photo-detector mechanism referenced above.

What is claimed is:

1. A scalable quantum computer, comprising:
   a first classical to quantum interface device (CQI) connected with a first quantum processing unit (QPU) and configured to control the first QPU;
   a second CQI connected with a second QPU and configured to control the second QPU, the CQIs being configured to send and receive classical communications to and from a classical central processing unit (CCPU);
   a pair generator for generating a pair of entangled mobile quantum bits (qubits) with each mobile qubit being sent to a QPU;
   a first QPU having a source qubit with an original quantum state, the first QPU being connected with the pair generator via a quantum communication channel and being configured to receive a mobile qubit from the pair generator and perform a sequence of operations such that the mobile qubit interacts with the source qubit when a teleportation algorithm is initiated, during which the source qubit and the mobile qubit are measured with the result of the measurement being teleported to a second QPU; and a second QPU connected via a quantum communication channel with the pair generator, the second QPU being configured to receive a mobile qubit from the pair generator and to receive the result of the measurement from the first QPU, the second QPU being further configured to perform operations on the mobile qubit that correlate to the result of the measurement and leave the mobile qubit in the second QPU in the original quantum state of the source qubit in the first QPU.

2. A scalable quantum computer as set forth in claim 1, wherein the pair generator is an Einstein-Podolsky-Rosen pair generator (EPRPG) for generating an entangled Einstein-Podolsky-Rosen (EPR) pair, with the EPR being the pair of entangled mobile quantum bits (qubits).

3. A scalable quantum computer as set forth in claim 2, wherein each QPU is configured to store at least two resident qubits, a source qubit and a mobile qubit; perform one and two qubit logical operations on its resident qubits; and measure the states of its resident qubits.

4. A scalable quantum computer as set forth in claim 3, wherein the EPRPG is connected via a quantum communication channel with the QPUs via a uni-directional quantum communication channel with a flow from the EPRPG to the respective QPU.

5. A scalable quantum computer as set forth in claim 4, further comprising a classical central processing unit (CCPU) classically connected with the CQIs and the EPRPG.

6. A scalable quantum computer as set forth in claim 5, further comprising a random access memory (RAM) classically connected with the CCPU, the CQIs, and the EPRPG.

7. A scalable quantum computer as set forth in claim 6, further comprising a purification protocol for receiving mobile qubits prior to the QPU and executing a set of quantum logic operations on them to create a single EPR pair of high entanglement fidelity.

8. A scalable quantum computer as set forth in claim 7, wherein the scalable quantum computer is configured to perform the following operations in a teleportation algorithm:
apply physical qubit operations to the mobile qubit and the source qubit in the first QPU;
measure the source qubit and the mobile qubit in the first QPU;
classically communicate the measurement results from the first CQI to the CCPU;
CCPU process the measurement results; and
instruct the second CQI to perform certain first CQI measurement dependent physical qubit operations on the mobile qubit in the second QPU.

9. A scalable quantum computer as set forth in claim 8, further comprising additional QPUs for receiving the mobile qubits, the additional QPUs and the first and second QPUs collectively being a plurality of QPUs, and the plurality of QPUs and the EPRPG collectively being a quantum computer group.

10. A scalable quantum computer as set forth in claim 9, further comprising a switching network for directing the mobile qubits from the EPRPG to two QPUs in the plurality of QPUs.

11. A scalable quantum computer as set forth in claim 10, further comprising a plurality of quantum computer groups and an EPRPG quantumly connected with the EPRPGs in the plurality of quantum computer groups.

12. A scalable quantum computer as set forth in claim 11, wherein the CQIs are configured to receive classical communications from the CCPU specifying logical qubit operations to be performed on the QPU qubits, with the CQIs translating the logical qubit operations into physical operations on the resident qubits.

13. A scalable quantum computer as set forth in claim 11, wherein the CQIs are configured to receive classical communications from the CCPU specifying physical operations to be performed on the QPU qubits.

14. A scalable quantum computer as set forth in claim 1, wherein each QPU is configured to store at least two resident qubits, a source qubit and a mobile qubit; perform one and two qubit logical operations on its resident qubits; and measure the states of its resident qubits.

15. A scalable quantum computer as set forth in claim 1, wherein the pair generator is connected via a quantum communication channel with the QPUs via a uni-directional quantum communication channel with a flow from the pair generator to the respective QPU.

16. A scalable quantum computer as set forth in claim 1, further comprising a classical central processing unit (CCPU) classically connected with the CQIs and the pair generator.

17. A scalable quantum computer as set forth in claim 1, further comprising a random access memory (RAM) classically connected with the CCPU, the CQIs, and the pair generator.

18. A scalable quantum computer as set forth in claim 1, further comprising a purification protocol for receiving mobile qubits prior to the QPU and executing a set of quantum logic operations on them to create a single pair of qubits of high entanglement fidelity.

19. A scalable quantum computer as set forth in claim 1, wherein the scalable quantum computer is configured to perform the following operations in a teleportation algorithm:
apply physical qubit operations to the mobile qubit and the source qubit in the first QPU;
measure the source qubit and the mobile qubit in the first QPU;
classically communicate the measurement results from the first CQI to the CCPU;
CCPU process the measurement results; and
instruct the second CQI to perform certain first CQI measurement dependent physical qubit operations on the mobile qubit in the second QPU.

20. A scalable quantum computer as set forth in claim 1, further comprising additional QPUs for receiving the mobile qubits, the additional QPUs and the first and second QPUs collectively being a plurality of QPUs, and the plurality of QPUs and the pair generator collectively being a quantum computer group.

21. A scalable quantum computer as set forth in claim 20, further comprising a switching network for directing the mobile qubits from the pair generator to two QPUs in the plurality of QPUs.

22. A scalable quantum computer as set forth in claim 20, further comprising a plurality of quantum computer groups and a pair generator quantumly connected with the pair generators in the plurality of quantum computer groups.

23. A scalable quantum computer as set forth in claim 1, wherein the CQIs are configured to receive classical communications from the CCPU specifying logical qubit operations to be performed on the QPU qubits, with the CQIs translating the logical qubit operations into physical operations on the resident qubits.

24. A scalable quantum computer as set forth in claim 1, wherein the CQIs are configured to receive classical communications from the CCPU specifying physical operations to be performed on the QPU qubits.

25. A method for forming a scalable quantum computer, comprising acts of:
- connecting a first classical to quantum interface device (CQI) with a first quantum processing unit (QPU), where the first CQI is configured to control the first QPU;
- connecting a second CQI with a second QPU, where the second CQI is configured to control the second QPU, the CQIs being configured to send and receive classical communications to and from a classical central processing unit (CCPU);
- quantumly connecting a pair generator to each QPU, the pair generator being capable of generating a pair of entangled mobile quantum bits (qubits) with each mobile qubit being sent to a QPU;
- a first QPU having a source qubit with an original quantum state, the first QPU being connected with the pair generator via a quantum communication channel and being configured to receive a mobile qubit from the pair generator and perform a sequence of operations such that the mobile qubit interacts with the source qubit when a teleportation algorithm is initiated, during which the source qubit and the mobile qubit are measured with the result of the measurement being teleported to a second QPU; and
- a second QPU connected via a quantum communication channel with the pair generator, the second QPU being configured to receive a mobile qubit from the pair generator and to receive the result of the measurement from the first QPU, the second QPU being further configured to perform operations on the mobile qubit that correlate to the result of the measurement and leave the mobile qubit in the second QPU in the original quantum state of the source qubit in the first QPU.

26. The method as set forth in claim 25, wherein in the act of quantumly connecting a pair generator to each QPU, the pair generator is an Einstein-Podolsky-Rosen pair generator (EPRPG) for generating an entangled Einstein-Podolsky-Rosen (EPR) pair, with the EPR being the pair of entangled mobile quantum bits (qubits).

27. The method as set forth in claim 25, wherein in the act of connecting the first and second CQIs with the first and second QPUs respectively, each QPU is configured to store at least two resident qubits, a source qubit and a mobile qubit; perform one and two qubit logical operations on its resident qubits; and measure the states of its resident qubits.

28. The method as set forth in claim 25, wherein in the act of quantumly connecting a pair generator to each QPU, the pair generator is connected via a quantum communication channel with the QPUs via a uni-directional quantum communication channel with a flow from the pair generator to the respective QPU.

29. The method as set forth in claim 25, further comprising an act of classically connecting a classical central processing unit (CCPU) with the CQIs and the pair generator.

30. The method as set forth in claim 25, further comprising an act of classically connecting a random access memory (RAM) with the CCPU, the CQIs, and the pair generator.

31. The method as set forth in claim 25, further comprising an act of connecting a purification protocol with the QPU for receiving mobile qubits prior to the QPU and executing a set of quantum logic operations on them to create a single pair of qubits of high entanglement fidelity.

32. The method as set forth in claim 25, further comprising an act of configuring the scalable quantum computer to perform the following operations in a teleportation algorithm:
- apply physical qubit operations to the mobile qubit and the source qubit in the first QPU;
- measure the source qubit and the mobile qubit in the first QPU;
- classically communicate the measurement results from the first CQI to the CCPU;
- CCPU process the measurement results; and
- instruct the second CQI to perform certain first CQI measurement dependent physical qubit operations on the mobile qubit in the second QPU.

33. The method as set forth in claim 25, further comprising an act of connecting additional QPUs for receiving the mobile qubits, the additional QPUs and the first and second QPUs collectively being a plurality of QPUs, and the plurality of QPUs and the pair generator collectively being a quantum computer group.

34. The method as set forth in claim 33, further comprising an act of connecting a switching network to the pair generator for directing the mobile qubits from the pair generator to two QPUs in the plurality of QPUs.

35. The method as set forth in claim 33, further comprising an act of connecting a plurality of quantum computer groups a pair generator quantumly connected with the pair generators in the plurality of quantum computer groups.

36. The method as set forth in claim 25, further comprising an act of configuring the CQIs to receive classical communications from the CCPU specifying logical qubit operations to be performed on the QPU qubits, with the CQIs translating the logical qubit operations into physical operations on the resident qubits.

* * * * *